United States Patent [19]

Konicek et al.

[11] Patent Number: 5,512,381

[45] Date of Patent: Apr. 30, 1996

[54] COPPER FOIL LAMINATE FOR PROTECTING MULTILAYER ARTICLES

[75] Inventors: Jiri D. Konicek, Onalaska, Wis.; Donald E. Yuhas, Glen Ellyn, Ill.

[73] Assignee: AlliedSignal Inc., Morris Township, Morris County, N.J.

[21] Appl. No.: 126,478

[22] Filed: Sep. 24, 1993

[51] Int. Cl.$^6$ ............... B21C 37/00; C25D 7/04; B32B 15/08; B32B 15/20
[52] U.S. Cl. ............ 428/607; 428/624; 428/626; 428/674; 428/675; 428/246; 428/457
[58] Field of Search .................... 428/607, 674, 428/675, 457, 624, 626, 246

[56] References Cited

U.S. PATENT DOCUMENTS

| | | | |
|---|---|---|---|
| 3,990,926 | 11/1976 | Konicek | 156/3 |
| 4,113,576 | 9/1978 | Hutkin | 204/13 |
| 4,394,419 | 7/1983 | Konicek | 428/416 |
| 5,096,522 | 3/1992 | Kawachi et al. | 156/151 |
| 5,120,590 | 6/1992 | Savage | 428/76 |
| 5,153,050 | 10/1992 | Johnston | 428/209 |

*Primary Examiner*—James D. Withers
*Attorney, Agent, or Firm*—Harold N. Wells; Roger H. Criss

[57] ABSTRACT

A method for making multilayer laminates having at least one exposed layer of copper foil. The exposed layer of copper foil is covered with a adhesively attached protective metal sheet made of a copper prior to being laminated.

1 Claim, No Drawings

COPPER FOIL LAMINATE FOR PROTECTING MULTILAYER ARTICLES

BACKGROUND OF THE INVENTION

This invention relates generally to improvements in the laminated boards used in electronic circuitry.

Printed wiring boards (PWB's) are composites of an insulating core and one or more planar layers of circuitry. The insulating core comprises a thermosetting polymer, such as an epoxy resin, and a suitable reinforcing material, such as glass cloth. The core may be faced with a layer of copper foil on one or both sides to provide an electrically conductive path. The circuit patterns are created by photoimaging and etching of unwanted copper from these layers. Where there are multiple layers, the circuits are interconnected by through-plated holes precisely positioned in predetermined locations.

A number of patents have suggested the use of a strippable aluminum sheet as a protection and support for very thin layers of copper such as those which result from vapor deposition or electroplating processes. The layers are so thin, say less than 5 μm, that they are impractical to handle alone and a support is needed. One example may be found in U.S. Pat. No. 3,990,926 where copper is electroplated onto a disposable base sheet of aluminum, zinc or steel. An intermediate layer of a metal such as zinc or tin was suggested to improve adhesion.

In U.S. Pat. No. 4,394,419 an ultra-thin layer (1–12 μm) of copper was plated onto a copper carrier sheet after electroplating a thin intermediate layer of nickel, nickel-tin alloy, nickel-iron alloy, lead, or tin-lead alloy so that there are two distinct layers of copper. The present invention avoids the need for successive electroplating of metal layers on a copper foil and is concerned with more conventional weight copper foils of a thickness above about 8–12 μm.

In U.S. Pat. No. 5,153,050 another problem is discussed, namely, how to avoid damage or contamination of the thin copper foils disposed on the outside of multilayer laminates. The patentees proposed gluing a temporary layer of aluminum sheet onto copper foil before it is bonded to an insulating core by heating under pressure to cure the polymers in the core.

The general concept of gluing a protective sheet to copper foil is found also in U.S. Pat. No. 5,120,590 where, rather than aluminum, a sheet of a suitable plastic film was used to protect the copper foil until after it has been laminated to the core.

While the use of aluminum sheets to protect multilayer laminates has merit, it is evident that the patentees did not recognize the thermal expansion problem addressed in U.S. Pat. No. 5,350,621, incorporated by reference herein. Aluminum sheets also will interact by friction with the copper foil, which could result in damage to the foil and distortion resulting from the difference in the coefficient of expansion of aluminum relative to copper (aluminum expands about 1.5 times as much as copper). Also, drilling through an aluminum sheet may produce undesirable contamination of the copper circuit patterns.

The present inventors propose an improved method of protecting multilayer laminates which incorporates the insights of U.S. Pat. No. 5,350,621 and uses a sheet copper or a metal having a similar coefficient of thermal expansion to protect multilayer laminates during processing.

SUMMARY OF THE INVENTION

The invention is an improved method for manufacturing multilayer laminates, particularly, circuit boards which include at least one layer of copper foil having a thickness greater than about 8 μm disposed on a reinforced polymer layer (e.g., epoxy resin). One face of the foil will be adapted for adhering to the surface of the polymer layer and the second face, which will later be exposed, is covered during lamination. The surface of the copper foil to be exposed after the opposite face has been adhered to the reinforced polymer layer is adhesively attached to a sheet of copper foil or other material which has an similar coefficient of thermal expansion (CTE) such as 304 stainless steel, aluminum-bronze, brass, nickel-silver, and the like.

In another aspect, the invention is a package which comprises at least one multilayer laminate having a bonded surface layer of copper which is covered by a protective and disposable sheet of copper or a metal having a similar CTE.

If copper is used, the CTE of the protective sheet will be equal to that of the underlaying copper foil (17.4 ppm/°C.). The registration problems caused by differential thermal expansion of the press plate, copper, and laminate will be minimized. This is particularly important for thinner copper foils.

The protective metal layer will be releasably attached to the copper foil for ease of separation once the foil has been bonded to the epoxy laminate. This will be done by adhesives selected to withstand the conditions of bonding to epoxy laminates, but which permit subsequent removal of the protective copper layer. A continuous seal is not essential.

DESCRIPTION OF THE PREFERRED EMBODIMENTS

Making Reinforced Laminates

A thermoset resin is usually reinforced with a woven fabric, most commonly woven of glass fibers. The impregnation of the fabric may be done by various methods known in the art, for example, passing the substrate through a solution of the high molecular weight resin at a predetermined temperature. Following impregnation, the fabric may be passed through metering rolls so that the desired amount of resin is retained in the fabric, while any excess is squeezed out. Generally speaking, the resin content in commercial laminates is in a range of from about 30% to about 80% by weight of the impregnated cloth. As discussed in U.S. Pat. No. 5,350,621, the amount of resin and the dimensions of the reinforcing fabric may be adjusted so that the CTE of the laminate matches the CTE of copper foil. In one example, the amount of resin is within the range of about 50% to 57% for a brominated epoxy resin commonly designated as FR-4. The amount used is determined by the coefficient of thermal expansion of the resin, which typically will be between 55 to 65 ppm/°C. and the resin's Young's Modulus which typically will be between 0.45 to 0.55 Msi. The impregnated cloth may be subjected to a B-stage cure by heating in an oven at a temperature in a range of from about 150° C. to about 190° C. Thereafter, the resulting prepreg may be laid-up utilizing a predetermined number of plies with at least one sheet of copper and pressed at a temperature which may range from about 150° to about 200° C. and a pressure in the range of from about 100 to about 2000 psig (689.5–13,789 kPa gauge) to provide the desired laminate.

Resins

Some specific examples of the resin systems which may be employed include EPON resins from the Shell Chemical Company, which resins are the reaction products of epichlorohydrin and bisphenol-A. These series of resins are sold under the name of EPON 813, EPON 815, EPON 812, EPON 8201, EPON 825, EPON 826, EPON 828, EPON 8280, EPON 830, EPON 834, EPON 871, etc. Other epoxy resins which may be used include Dow 511, Dow 521, and Dow 531 (Dow Chemical Co.) A very common epoxy resin is Dow 521 which is designated FR-4.

Other thermosetting resins including polyimide, bismaleimide, triazine, polyester, and cyanate ester resins may be used, although, the required balance between the resin and the reinforcing fibers will differ from those appropriate for FR-4 epoxy laminates.

The resin solution will include a curing agent, depending upon the type of resin system which has been chosen as the impregnating agent. Examples of curing agents which may be employed with epoxy resins will include aliphatic amines such as diethylene triamine, triethylene tetraamine, and/or amides of the cyanoguanidine type.

Solvents such as ketones, including methyl ethyl ketone, diethyl ketone, N-methyl-2-pyrrolidone, etc., benzene, toluene, etc., may be employed to form the solution of the resin system and the curing agent.

The solution may also contain accelerators such as 2-methyl imidazole, BDMA, butadiene acrylonitrile, 2-ethyl-4-methyl imidazole, 2-phenylimidazole, 2-undecyl imidazole, 2-heptadecyl imidazole, etc., including their cyanoethyl and trimellitate derivatives.

Glass Fabrics

While for purposes of the invention it is not essential that the laminates have a CTE which matches that of the copper foil to which they are bonded, it is preferred. The following discussion relates particularly to aspects of the design of glass fabrics which may be used to create the preferred laminates, although it is to be understood that more conventional laminates may be employed.

Woven glass fabrics are generally made of yarns having up to about 1700 filaments, such filaments having diameters from about 3 to 15 µm. Plain weave fabrics may be characterized in having a specified number of lengthwise yarns (warp) per inch (or mm) and crossing yarns (fill) per inch (or mm).

As disclosed in U.S. Ser. No. 07/982,797 the amount of reinforcement in each direction of the fabric is an important determinant of the laminate CTE. The volume of reinforcement per unit area of a fabric, V1, is given by the following expression:

$$V1 = Nf.Ac.Ny$$

where $Nf$ is the number of filaments in each yarn
$Ac$ is the cross sectional area of each filament
$Ny$ are the number of yarns per unit length The volume reinforcement per unit area in the fill and warp directions of a fabric are given by: $V1_f = Nf.Ac_f.Ny_f$ for the fill direction $V1_w = Nf.Ac_w.Ny_w$ for the warp direction and the ratio, R, of fill to warp volumes is given by:

$$R = (Nf_w.Ac_w.Ny_w)/(Nf.Ac_f.Ny_f)$$

Thus, the ratio of fiber volume in the warp and fill directions is determined by the number of filaments in each yarn, their cross sectional area and the number of yarns per unit of length. The yarns will have a CTE depending on the material used; typical glass yarns having a CTE of about 5 ppm/°C. Generally, the volume of fibers in the fill direction should approximately equal the volume of fibers in the warp direction, preferably the fill yarns preferably should be slightly larger in volume compared to the warp yarns in order to provide the most uniform thermal expansion/contraction.

The difference between the fibers in warp and fill is related to their relative effect on laminate CTE values. To achieve a 17.4 ppm/°C. thermal expansion coefficient for glass fibers used with epoxy resins 0.300 fiber volume fraction for the warp fibers and a 0.325 fiber volume fraction for the fill fibers is preferred. Balanced fabrics will yield improved laminates, however, best results come from fabrics where the fill fiber volume is approximately 8% higher than the warp fiber volume.

Current multilayer thin laminates are usually manufactured using well established glass styles, defined, for example, in ANSI/IPC specification EG 140. It is typical of these conventional laminates that they do not follow the rules just discussed and have a larger volume of fibers in the warp direction relative to the fill direction. While such fabrics are commonly used, the present invention does not exclude such fabrics.

Copper Foil

Conductive pathways are formed on insulating cores from copper foils which are laminated to the cores under heat and pressure. The foils are quite thin, about 8 to 70 µm thick. There is an economic incentive to use the thinnest layers of copper possible and this in turn provides an incentive to support the thin foils and to protect them from contamination or physical damage.

Preparation of such foils is not part of the present invention but as is well known in the art, they are made by electrodeposition from a copper solution onto a rotating drum and then wound into rolls for use in electronic laminates. According to the present invention such copper foils are adhesively joined to protective metal sheets leaving one face exposed which has been adapted for being adhered to a fiber-reinforced insulating core. The exposed face is then laminated onto an insulating core or an assembly of foils and cores. The second face, which was protected during lamination, is subsequently exposed by removing the protective sheet.

Pressing

The laminates are typically made in heated multi-opening presses. The copper foil which is to be bonded to the laminate is contacted by a press plate which is often made from hardened stainless steel alloys. Preferably, the laminates are manufactured using press plates which closely match the CTE of copper. These can either be copper plates or stainless steel alloys such as 304 or 316 with CTE values close to the 17.4 ppm/°C. value for copper. The close match of the copper and laminate will insure that no instabilities arise from uncontrolled stresses in the laminates.

Protective Sheets

The discussion above provides an introduction to a discussion of the use of copper protective sheets to cover the multilayer laminates and protect the otherwise exposed copper foil surface.

As described in U.S. Pat. No. 5,153,050 the exposed copper foil layer is only one of many which may be in a multilayer laminate. In the present invention the insulating cores preferably are fabricated to have a CTE which matches that of the copper foil layers so as to avoid the registration problems, although protection of the copper foil from damage and contamination is the principal objective of the invention. Since the copper foils are quite thin, typically 8–70 μm, and even thinner, down to say 5 μm, it will be apparent that they can be readily damaged. Preferably, a sheet of copper or a material with the same CTE as copper such as 304 stainless steel, aluminum-bronze, brass, nickel-silver, and the like and having a thickness of about 8 to 250 μm will be placed over the face of the copper foil which will be exposed after lamination. The matching surfaces of the copper foil and sheet will be made and kept as free of contamination as possible. Generally, the protective sheet will be at least about 8–9 μm thick when used to prevent the copper surface from becoming contaminated. Thicker sheets will be needed to prevent denting or other physical distortion and thus sheets of 130 μm or more thickness will be preferred.

The method of assembling the copper and the protective sheet may be similar to that of the '050 patent, in which a flexible adhesive such as polyurethanes, polyalkenes, or nylons was applied around the perimeter of the copper foil to secure the protective sheet in place. After the assembled package of multilayer laminate(s) and copper protective sheets was heated and pressed to cure the polymers, the adhesive area was cut away to remove the finished laminates and to expose the protected copper surface. Adhesives may deteriorate at pressing temperatures and either make the protective sheet harder to remove or alternatively, fail to hold the protective sheet in place, if desired. Also, adhesives may contaminate the copper surface which is to be protected during pressing. Thus, the adhesives used should be selected to minimize problems.

The '050 patent suggests that "islands" of adhesive may be placed inboard of the adhesive layer to accommodate tooling pins associated with the press to be used. This technique may be used in the present invention if desired.

The adhesives may be of any suitable type such as Nylon 6, Nylon 66 (applied as an emulsion), polyurethanes, polyalkenes, or polystyrenes. The adhesives should maintain their grip during laminating, be relatively inexpensive and be easily applied in thin layers (typically a few microns). The adhesive areas are removed after lamination and thus the adhesives are not applied to areas where circuit patterns are to be developed. However, the adhesives should either retain their ability to releasably join the copper foil to the copper protective sheet at press temperatures or if not, they should not interfere with the subsequent removal of the protective sheet.

The present inventors have found that a continuous seal of adhesive is not required to protect the copper foil surface but that intermittent joining of the copper foil and the protective sheet is satisfactory. Consequently, intermittent spots of adhesives may be used while still providing adequate protection for the copper foil.

In a typical instance, a single sheet of copper foil will be treated on one face to improve adherence to a fiber-reinforced polymer core and the opposite face will be protected by being covered with a copper protective sheet as described above. The protective sheet remains in place until after the exposed copper face has been bonded to the fiber-reinforced polymer core, after which it may be removed or kept in place until the laminate is to be used. In other cases, a single protective sheet may be used to protect two sheets of copper foil so that a package of two polymer cores and two sheets of copper are pressed together and later separated.

We claim:

1. A protected sheet of copper foil for manufacturing multilayer laminates comprising:

(a) a sheet of copper foil having a thickness greater than about 8 μm and having a first face adapted for adhering to a fiber reinforced polymer layer and a second protected face to be exposed after said first face is adhered to said fiber reinforced polymer layer;

(b) a protective sheet of copper having a thickness of about 8 to 250 μm covering said second copper foil face and adhesively attached thereto by a non-metallic adhesive in areas where circuit patterns are not to be developed.

* * * * *